United States Patent [19]

Nakamura et al.

[11] Patent Number: 5,250,389
[45] Date of Patent: Oct. 5, 1993

[54] PHOTOSENSITIVE ELASTOMER COMPOSITION

[75] Inventors: Shohei Nakamura; Kousi Anai, both of Fuji, Japan

[73] Assignee: Asahi Kasei Kogyo Kabushiki Kaisha, Osaka, Japan

[21] Appl. No.: 849,388
[22] PCT Filed: Feb. 14, 1992
[86] PCT No.: PCT/JP92/00148
§ 371 Date: May 12, 1992
§ 102(e) Date: May 12, 1992
[87] PCT Pub. No.: WO92/15046
PCT Pub. Date: Mar. 9, 1992

[30] Foreign Application Priority Data

Feb. 15, 1991 [JP] Japan ............... 3-21844

[51] Int. Cl.$^5$ .............. G03C 1/725
[52] U.S. Cl. .............. 430/281; 430/286; 430/288; 430/312; 430/306; 522/116; 522/120; 522/121
[58] Field of Search ......... 430/281, 286, 288, 302, 430/306, 325, 326, 905; 522/116, 120, 121

[56] References Cited

U.S. PATENT DOCUMENTS

| | | |
|---|---|---|
| 4,045,231 | 8/1977 | Toda et al. ............... 96/115 |
| 4,177,074 | 12/1979 | Proskow ............... 430/286 |
| 4,197,130 | 4/1980 | Nakamura et al. ............... 96/87 |
| 4,266,005 | 5/1981 | Nakamura et al. ............... 430/271 |
| 4,431,232 | 2/1984 | Proskow ............... 430/286 |
| 4,894,315 | 1/1990 | Feinberg et al. ............... 430/281 |
| 4,925,775 | 5/1990 | Hoffmann ............... 430/306 |
| 4,933,261 | 6/1990 | Hoffmann ............... 430/286 |
| 4,959,285 | 9/1990 | Hoffmann ............... 430/11 |

FOREIGN PATENT DOCUMENTS

| | | |
|---|---|---|
| 52-64301 | 5/1977 | Japan . |
| 63-70242 | 3/1988 | Japan . |
| 63-207875 | 8/1988 | Japan . |
| 1366769 | 9/1974 | United Kingdom . |
| 1552653 | 9/1979 | United Kingdom . |

Primary Examiner—Jack P. Brammer
Attorney, Agent, or Firm—Birch, Stewart, Kolasch & Birch

[57] ABSTRACT

Disclosed is a photosensitive elastomer composition comprising (1) a thermoplastic block copolymer comprising at least one monovinyl substituted aromatic hydrocarbon polymer block and at least one conjugated diene polymer block, wherein a monovinyl substituted aromatic hydrocarbon content (A) is 10 to 35% by weight, and the vinyl content (V) of a conjugated diene is 20 to 50%, and the (A) and the (V) satisfy the formula: $40 \leq (A)+(V) \leq 70$; (2) an ethylenically unsaturated compound component; and (3) a photopolymerization initiator. This photosensitive elastomer composition exhibits excellent photosensitivity, so that not only can the time required for insolubilization of the composition be reduced to about half the time which has conventionally been necessary, but also small dots and lines can be surely formed without occurrence of chipping at the time of development, thereby enabling the composition to be advantageously used in the fields of printing plates, photoresists, and screens for screen printing. Especially when this composition is used for the production of a flexographic printing plate, an excellent flexible flexographic printing plate capable of printing fine images can be obtained.

8 Claims, No Drawings

PHOTOSENSITIVE ELASTOMER COMPOSITION

TECHNICAL FIELD

The present invention relates to a photosensitive elastomer composition suitable for producing a flexographic printing plate. More particularly, the present invention is concerned with a photosensitive elastomer composition comprising a specific amount of a thermoplastic block copolymer comprising a monovinyl substituted aromatic hydrocarbon polymer block and a conjugated diene polymer block, wherein the monovinyl substituted aromatic hydrocarbon content (A) and the vinyl content (V) of the conjugated diene are, respectively, in specific ranges and the contents (A) and (V) satisfy a specific relationship; an ethylenically unsaturated compound component; and a photopolymerization initiator. The composition of the present invention exhibits excellent photosensitivity. Therefore, when this composition is used to produce, for example, a flexographic printing plate, not only can the time for the plate production be reduced to about half the time which has conventionally been necessary, but also small dots and lines can surely be formed without occurrence of chipping at the time of development, thereby enabling the production of an excellent flexographic printing plate capable of printing fine images.

BACKGROUND ART

Conventionally, a rubber plate for use in flexographic printing has been produced by etching a metallic plate to produce an original plate, preparing a matrix plate from, e.g., a plastic by using the original plate, and pouring a rubber into the matrix plate, followed by pressing. However, this method has drawbacks in that numerous steps are needed, thus requiring too great a cost and too much time. In addition, this method has also drawbacks in that the produced rubber plate itself is low in thickness precision and, hence, it is necessary to raise the thickness precision by shaving the back side of the plate before use.

In order to solve this problem, there has recently been proposed a method of producing a flexographic printing plate from a photosensitive resin composition. According to this method, not only can the step for the above-mentioned shaving of the back side of the plate be eliminated, but also it is possible to obtain a printing plate capable of printing a pattern which is finer, as compared to a pattern which can be printed by the conventional rubber plate.

As these photosensitive elastomer compositions, there are known, for example, those disclosed in Japanese Patent Application Laid-Open Specification No. 47-37521 (corresponding to British Patent No. 1366769), Japanese Patent Application Laid-Open Specification No. 51-106501 (corresponding to U.S. Pat. No. 4045231), Japanese Patent Application Laid-Open Specification No. 52-64301, Japanese Patent Application Laid-Open Specification No. 53-127004 (corresponding to U.S. Pat. No. 4197130), Japanese Patent Application Laid-Open Specification No. 54-110287 (corresponding to U.S. Pat. No. 4177074), Japanese Patent Application Laid-Open Specification No. 55-48744 (corresponding to U.S. Pat. No. 4266005) and Japanese Patent Application Laid-Open Specification No. 58-62640 (corresponding to U.S. Pat. No. 4431723).

Of these, a photosensitive elastomer composition in which a thermoplastic block copolymer is used as a binder (such as those disclosed in Japanese Patent Application Laid-Open Specification Nos. 47-37521 and 53-127004), has very excellent cold-flow resistance in an uncured state and has very excellent rubbery elasticity in a cured state and, hence, such a solid photosensitive elastomer composition has been mainly in practical use for producing a flexographic printing plate. Especially, a photosensitive elastomer composition, such as those disclosed in Japanese Patent Application Laid-Open Specification No. 53-127004 in which fumarate or maleate is used as an ethylenically unsaturated compound, exhibits excellent thermal stability at the time of heat molding for the production of a sheet therefrom and during the storage at high temperatures. Also, a printing plate obtained by using the above-mentioned composition has properties desired for a flexographic printing plate, such as good flexibility, so that the printing plate can be fittedly mounted onto the cylinder of a printing machine. In the above conventional photosensitive elastomer compositions, there is used a block copolymer in which the content of a monovinyl substituted aromatic hydrocarbon polymer block used is about 20 to 40% by weight, but the vinyl content of a diene compound polymer block used is generally low, namely, 15% or less.

However, a photosensitive elastomer composition comprising the conventional block copolymer as mentioned above, has problems mentioned below. First, these conventional photosensitive elastomer compositions are low in sensitivity and therefore, the time required for the insolubilization of compositions by photocuring, so that the compositions can be insoluble in a developer, is too long. In some cases, imagewise exposure requires as much as 20 to 30 minutes or more, thus causing the total time necessary for plate production to be long. In this instance, if the exposure time is reduced, a problem arises that the insolubilization of the photosensitive elastomer composition becomes insufficient, rendering it difficult to form relief portions corresponding to small dots and lines. On the other hand, if the intensity of light is increased, a problem arises that relief portions corresponding to small dots and lines become broad and that reverse lines are not formed.

Second, the conventional photosensitive elastomer compositions have a problem in that, unless the specific type of an ethylenically unsaturated compound to be used is selected, the photocured products are unsatisfactory in various mechanical properties, so that chipping is likely to occur especially in the relief portions corresponding to dots and lines during the development which is usually conducted with a solvent by means of a brush. In this case, there is a dilemma such that if a compound capable of preventing chipping from occurring at the time of development is selected as an ethylenically unsaturated compound, the obtained plate is poor in flexibility. Especially when fumarate or maleate is used, which, as mentioned above, is known to markedly improve the flexibility of a photocured plate and the thermal stability of a photosensitive composition before light exposure, the problem of the chipping of the relief becomes more serious.

On the other hand, in recent years, with an increasing demand for flexographic printing plates, the printing of finer images has been required in flexographic printing. For this reason, there is an increasing demand for forming smaller dots and characters. Accordingly, it has become very important to solve the problem that relief portions corresponding to such small dots and characters are damaged due to the occurrence of chipping during the operation of washing-out with an organic solvent by means of a brush after the light exposure. Further, a demand has been increased for the reduction of the plate production time, especially for the reduction of exposure time.

In these situations, the present inventors have made extensive and intensive studies with a view toward developing a photosensitive elastomer composition for producing a flexographic printing plate, which is not only capable of surely forming small dots and lines while reducing the plate production time, but also does not suffer from the occurrence of chipping in a photocured plate at the time of development, so that it can be especially useful for the production of a flexographic printing plate. As a result, the present inventors have found that when, with respect to a photosensitive elastomer composition comprising a thermoplastic block copolymer, an ethylenically unsaturated compound component and a photopolymerization initiator, there is used as the thermoplastic block copolymer a specific amount of a thermoplastic block copolymer comprising at least one monovinyl substituted aromatic hydrocarbon polymer block and at least one conjugated diene polymer block, the block copolymer having a monovinyl substituted aromatic hydrocarbon content (A) of 10 to 35% by weight and the conjugated diene having a vinyl content (V) of 20 to 50% by weight, wherein the (A) and the (V) satisfy the following formula:

$$40 \leq (A) + (V) \leq 70,$$

the photosensitivity of the composition is dramatically improved, so that the object of the development can be attained. The present invention has been completed, based on this finding.

DISCLOSURE OF THE INVENTION

Accordingly, it is a primary object of the present invention to provide a novel photosensitive elastomer composition which is capable of not only shortening the plate production time to about half the time which has conventionally been necessary, but also surely forming small dots and lines and preventing the occurrence of chipping of the plate at the time of development, so that the composition is useful for the production of a printing plate, a photoresist and a screen for screen printing, especially for the production of a flexographic printing plate.

The foregoing and other objects, features and advantages of the present invention will be apparent from the following detailed description and appended claims.

Essentially, according to the present invention, there is provided a photosensitive elastomer composition comprising:

(1) at least 50% by weight, based on the weight of the elastomer composition, of a thermoplastic block copolymer comprising at least one monovinyl substituted aromatic hydrocarbon polymer block comprised mainly of a monovinyl substituted aromatic hydrocarbon and at least one conjugated diene polymer block comprised mainly of a conjugated diene, the block copolymer having a monovinyl substituted aromatic hydrocarbon content (A) of 10 to 35% by weight and the conjugated diene having a vinyl content (V) of 20 to 50%, wherein the (A) and the (V) satisfy the following formula:

$$40 \leq (A) + (V) \leq 70;$$

(2) 1 to 20% by weight, based on the weight of the elastomer composition, of an ethylenically unsaturated compound component; and (3) 0.1 to 3% by weight, based on the weight of the elastomer composition, of a photopolymerization initiator.

The vinyl content of the conjugated diene of the thermoplastic block copolymer used in the photosensitive elastomer composition of the present invention, can be determined as follows. For example, in the case of a styrene-butadiene elastomer, the determination can be conducted by the Hampton Method described in Anal. Chem., 21, 923 (1949) from the IR spectrum of a 1% carbon disulfide solution of the elastomer. In the case of a styrene-isoprene elastomer, the vinyl content can be determined according to the formula:

$$\text{vinyl \%} = A/(A+2B) \times 100$$

wherein A and B respectively represent the peak area of the signal of a δ value of about 4.7 ppm ascribed to the vinyl linkage on a H$^1$-NMR spectrum and the peak area of the signal of a δ value of about 5.1 ppm ascribed to the 1,4-linkage on a H$^1$-NMR spectrum.

With respect to the content of the monovinyl substituted aromatic hydrocarbon, in the case of a styrene-butadiene block copolymer, the determination can be conducted from an IR spectrum in accordance with the Hampton Method. This method is described in the same literature as mentioned above in connection with the method for determining the vinyl content. In the case of a styrene-isoprene block copolymer, the content of the monovinyl substituted aromatic hydrocarbon can be determined in accordance with the following formula, from the peak area (C) of the signal ascribed to the hydrogen of the benzene ring at a δ value in the range of from 6.3 to 7.3 and the total peak area (D) on a H$^1$-NMR:

$$\text{Styrene content (molar ratio)} = Sm = 8/5 \times C/D$$

$$\text{Styrene content (\% by weight)} = \frac{(104 \times Sm) \times 100}{104 \times Sm + 68 \times (1 - Sm)}.$$

With respect to the analysis for the above-mentioned content determination, when the analysis is to be conducted on a block copolymer which has already been formulated into a photosensitive elastomer composition, the analysis is made after separating the block copolymer from the composition.

Generally, in producing a printing plate from a photosensitive elastomer composition an imagewise exposure is continued until the formation is completed of the smallest patterns, such as the least highlight, the smallest dots, the finest lines, etc, which require the greatest light exposure dose for the formation thereof. Accordingly, when a photosensitive elastomer composition has a higher photosensitivity, the desired highlight can be formed in a shorter time of imagewise exposure. Thus, from the viewpoint of the reduction of the plate production time, a higher photosensitivity has been desired of a photosensitive elastomer composition. The more the imagewise light exposure dose, the greater the degree of the formation of the smaller dots and lines. However, when the imagewise light exposure dose is too large, overexposure is likely to occur at such a portion as a reverse line, so that disappearing (no formation) of reverse image portions is caused. As a result, the final plate becomes defective. Thus, with respect to the conventional photosensitive elastomer composition, it was difficult to conduct image-wise exposure to such an extent that smaller dots are formed while maintaining a balance in image formation between the smaller dots and reverse image portions.

After the imagewise exposure is conducted, the development by removing the unexposed portion is usually conducted by brushing by the use of a solvent capable of dissolving the photosensitive elastomer composition. During the developing operation, various mechanical properties of the relief portion become low due to a swelling caused by the developer, so that the rubbing with a brush frequently causes a chipping phenomenon in which the relief portion is partially chipped off. Such a phenomenon is liable to occur at small dots and characters. When printing is done by the use of a plate which has been damaged due to the occurrence of chipping, defective prints are produced, that is, portions corresponding to the chipped-off portions are not printed. Also, with respect to the highlight portion, chipping at the time of development is most likely to occur at smaller highlights, so that the size of a highlight which can be formed is limited. Conventionally, in many cases, a 3% highlight was the smallest one in the pattern, but a demand has recently been increased for the formation of a 1% highlight. In this instance, however, there is a problem such that even if imagewise exposure is applied in a dose as much as possible within the exposure dose range within which disappearing of a reverse line is not caused, it is impossible to form such a 1% highlight due to the occurrence of chipping at the time of development. This problem has been likely to arise, especially when there is employed a fumarate or maleate which are attracting attention because of their capability of improving not only the thermal stability of a photosensitive composition prior to light exposure, but also the flexibility of a flexographic printing plate produced from the composition, or when a methacrylate is employed as the ethylenically unsaturated compound.

According to the present invention, in a photosensitive elastomer composition comprising a thermoplastic block copolymer, an ethylenically unsaturated compound component and a photopolymerization initiator, by the use of a block copolymer comprising a conjugated diene compound polymer block having a vinyl content in a specific range and a monovinyl substituted aromatic hydrocarbon polymer block having a monovinyl substituted aromatic hydrocarbon content in a specific range, it has become possible to obtain a photosensitive elastomer composition which is high in photosensitivity, chipping resistance at the time of development and rubbery elasticity, so that it is especially useful as a material for producing a flexographic printing plate.

In the photosensitive elastomer composition of the present invention, a block copolymer, which is incorporated in an amount of at least 50% by weight, based on the weight of the elastomer composition, comprises at least one, preferably two or more polymer blocks comprised mainly of a monovinyl substituted aromatic hydrocarbon and at least one polymer block comprised mainly of a conjugated diene.

In the composition of the present invention, the terminology "polymer block comprised mainly of a monovinyl substituted aromatic hydrocarbon" means a copolymer block comprising a monovinyl substituted aromatic hydrocarbon and a diene compound, wherein the monovinyl substituted aromatic hydrocarbon content is greater than 50% by weight, preferably 70% by weight or more, and/or a homopolymer block of a monovinyl substituted aromatic hydrocarbon. The terminology "polymer block comprised mainly of a conjugated diene" means a copolymer block comprising a diene compound and a monovinyl substituted aromatic hydrocarbon, wherein the conjugated diene compound content is greater than 50% by weight, preferably 70% by weight or more, and/or a homopolymer block of a diene compound.

The distribution of the monovinyl substituted aromatic hydrocarbon in each copolymer block may be uniform or tapered. The terminology "tapered distribution" referred to herein means that the monovinyl substituted aromatic hydrocarbon content continuously changes in the longitudinal direction of the block. Each copolymer block may contain one or more portions in which the monovinyl substituted aromatic hydrocarbon has a uniform distribution and/or one or more portions in which the monovinyl substituted aromatic hydrocarbon has a tapered distribution.

The thermoplastic block copolymer (1) used in the photosensitive elastomer composition of the present invention has a requirement that the monovinyl substituted aromatic hydrocarbon content (A) be 10 to 35% by weight, preferably 15 to 30% by weight, and the vinyl content (V) of the diene compound chain be 20 to 50%, preferably 25 to 45%, more preferably 30 to 40%, and the (A) and the (V) satisfy the following formula:

$$40 \leq (A)+(V) \leq 70,$$

preferably
$$45 \leq (A)+(V) \leq 60.$$

The diene compound is defined as a compound having a conjugated diene linkage, such as a butadiene, an isoprene, etc. Of these, most preferred is a butadiene which exhibits excellent ozone resistance and is effective for imparting excellent properties to an ultimate flexographic printing plate.

When the content (A) and the content (V) and the value of (A)+(V) are not within the above-mentioned ranges, the obtained photosensitive elastomer composition cannot have satisfactory photosensitivity, so that not only satisfactory chipping resistance at the time of development but also rubbery elasticity suitable for an ultimete flexographic printing plate cannot be obtained.

As the monovinyl substituted aromatic hydrocarbon contained in the block copolymer used in the present invention, there may be mentioned, for example, styrene, α-methylstyrene, p-methylstyrene, o-methylstyrene etc., a representative example of which is styrene. These may be employed individually or in combination.

The block copolymer used in the present invention may be either of a linear type or of a radial type.

As the thermoplastic block copolymer used in the present invention comprising at least one monovinyl substituted aromatic hydrocarbon polymer block and at least one conjugated diene polymer block, the block copolymer having a monovinyl substituted aromatic hydrocarbon content (A) of 10 to 35% by weight and the conjugated diene having a vinyl content (V) of 20 to 50%, wherein the (A) and the (V) satisfy the following formula:

$$40 \leqq (A)+(V) \leqq 70,$$

one type of a block copolymer satisfying the above requirements can be employed alone. Alternatively, a plurality of types of block copolymers can be employed, which satisfy the above requirements as determined using the average values obtained by measurement of a mixture of all types of block copolymers used.

The thermoplastic block copolymer usable in the present invention can be obtained by the method disclosed, for example, in Japanese Patent Application Laid-Open Specification No. 63-27573 (corresponding to U.S. Pat. No. 4,792,584). The content of a monovinyl substituted aromatic hydrocarbon can be adjusted within the range defined in the present invention by regulating the amount thereof to be charged. The adjustment of the vinyl linkage content of a conjugated diene can be made by employing a polymerization method in which an organic lithium compound in a hydrocarbon solvent is used as an initiator and by using a polar compound as a vinylating agent, wherein the type and amount of the polar compound are selected and the polymerization temperature is controlled.

As hydrocarbon solvents, there can be employed aliphatic hydrocarbons, such as butane, pentane, hexane, isopentane, heptane, octane, isooctane and the like, alicyclic hydrocarbons, such as cyclopentane, methylcyclopentane, cyclohexane, methylcyclohexane, ethylcyclohexane and the like, or aromatic hydrocarbons, such as benzene, xylene and the like. As organic lithium compounds, there can be employed organic monolithium compounds, organic dilithium compounds, organic polylithium compounds and the like. Examples of organic lithium compounds include ethyllithium, propyllithium, butyllithium, hexamethylenedilithium and the like. Examples of polar compounds to be added for the adjustment of the vinyl linkage content include ethers, such as tetrahydrofuran, diethyleneglycol dimethylether, diethyleneglycol dibutylether and the like, amines, such as triethylamine, tetramethylethylenediamine and the like, thioethers, phosphines, alkylbenzenesulfonate, and alkoxides of potassium and sodium.

The ethylenically unsaturated compound component used in the present invention is not particularly restricted. As examples of ethylenically unsaturated compounds, there can be mentioned such an acrylate and a methacrylate as disclosed in Japanese Patent Application Laid-Open Specification No. 47-37521 and Japanese Patent Application Laid-Open Specification No. 54-110287, such an N-substituted maleimide as disclosed in Japanese Patent Application Laid-Open Specification No. 55-48744, and a compound represented by the following formula (I):

(I)

wherein each of $R^1$ and $R^2$ independently represent an alkyl group having 2 to 30 carbon atoms, an aryl group having 2 to 30 carbon atoms or an aralkyl group having 2 to 30 carbon atoms, and a geometrical isomer of the compound of formula (I). These ethylenically unsaturated compounds may be employed individually or in combination with each other. When these are employed in combination with each other, from the viewpoint of obtaining a printing plate which is most preferred as a flexographic printing plate having excellent rubbery elasticity and flexibility and having small dots and characters clearly formed therein, it is preferred that at least one of the compounds represented by the above-mentioned formula (I) be used at a proportion of at least 20% by weight, more preferably at least 50% by weight, based on the weight of the ethylenically unsaturated compound component. In the above-mentioned formula (I), it is preferred that each of $R^1$ and $R^2$ independently represents an alkyl group having 6 to 12 carbon atoms.

The compounds represented by formula (I) above are fumarates and maleates. As mentioned above, although fumarates and maleates are useful for attaining a good flexibility of a photocured plate and a good thermal stability of a photosensitive composition prior to light exposure, the conventional photosensitive elastomer composition in which a fumarate or a maleate is used as an ethylenically unsaturated compound, has a series problem in that chipping of a printing plate is likely to occur at the time of development. Unexpectedly, however, when a fumarate or a maleate is used as an ethylenically unsaturated compound in the present invention, not only can the thermal stability of the composition prior to light exposure be improved, but also excellent rubbery elasticity and flexibility are attained and chipping of a printing plate at the time of development, which has been a drawback accompanying the use of a fumarate or a maleate, is prevented, so that a printing plate can be obtained in which even small dots and characters are clearly formed and which is most excellent as a flexographic printing plate.

Examples of these fumarates and maleates include dibutylester fumarate, dioctylester fumarate, distearylester fumarate, butyloctylester fumarate, diphenylester fumarate, dibenzilester fumarate, dibutylester maleate, dioctylester maleate, and bis(3-phenylpropyl) ester maleate. Fumarates and maleates are not limited to the above examples. These compounds may be employed individually or in combination.

Of fumarates and maleates, fumarates are more preferred since a fumarate has advantages in that it has a high reactivity and a low toxicity as compared to a maleate.

The suitable amount of the ethylenically unsaturated compound component used in the present invention varies in accordance with the type of the ethylenically unsaturated compound and the properties, e.g., hardness, of the desired flexographic printing plate, but it is necessary that the amount be at least 1% by weight, based on the weight of the composition. When the amount of the ethylenically unsaturated compound is less than 1% by weight, a satisfactory printing plate cannot be obtained since the insolubilization of the composition so as to be solvent-insoluble is not fully attained even upon irradiation with light. On the other hand, when the amount is too large, the obtained printing plate is hard and brittle, and low in rubbery elasticity, so that, in some cases, it becomes impossible to use the plate as a flexographic printing plate. For this reason, it is desirable that the amount be not greater than 20% by weight. The more preferable amount is in the range of from 5 to 15% by weight.

As the photopolymerization initiator usable in the photosensitive elastomer composition of the present invention, there can be mentioned conventional initiators, e.g., benzoin and ethers thereof, such as benzoin methyl ether, benzoin ethyl ether, benzoin isopropyl ether, benzoin isobutyl ether, α-methylolbenzoin methyl ether, α-methoxybenzoin methyl ether, 2,2-diethoxyphenylacetophenone and the like.

The photopolymerization initiator is incorporated in an effective amount for polymerization, that is, in an amount of at least 0.001% by weight, based on the weight of the composition. Generally, it is preferred to incorporate the initiator in an amount in the range of from 0.1 to 3% by weight.

The photosensitive elastomer composition of the present invention may contain 0.001 to 2% by weight, based on the weight of the composition, of a thermal polymerization inhibitor.

Examples of thermal polymerization inhibitors include conventional inhibitors, such as 2,6-di-t-butyl-p-cresol, p-methoxyphenol, pentaerythritoltetrakis[3-(3',5'-di-t-butyl-4'-hydroxy) phenylpropionate] hydroquinone, t-butylcatechol and t-butylhydroxyanisole.

Further, the photosensitive elastomer composition of the present invention may contain a plasticizer, if desired. This plasticizer serves to facilitate the removal of an unexposed portion of the photosensitive elastomer composition, improve the mechanical properties of the cured portion, and facilitate the production of a photosensitive elastomer composition, particularly the molding thereof. The plasticizer may be incorporated in an amount in the range of up to 40% by weight, depending on the desired properties. Examples of plasticizers include a hydrocarbon oil, such as naphthene oil and paraffin oil, low molecular weight polystyrene (having a molecular weight of 3000 or less), a copolymer of α-methylstyrene and vinyltoluene, petroleum resin, pentaerythritolester of hydrogenated rosin, a polyterpene resin, a polyester resin, polyethylene, poly(α-methylstyrene), polyacrylate, liquid 1,2- and 1,4-polybutadiene, a liquid acrylonitrile-butadiene copolymer, a liquid styrene-butadiene copolymer, stearic acid, polypentadiene, polyurethane and ethylene propylene rubber.

The photosensitive elastomer composition of the present invention is solid at room temperature. However, it may have tackiness, depending on the formulation. Therefore, when the composition is used for plate production, a thin film of a material, such as polyethylene, polypropylene, polyester and polystyrene may be laminated on the surface of the composition so that the composition can have a good contact with an image bearing transparency to be disposed thereon, and that the image bearing transparency can be re-used. This film is peeled off from the surface of the composition after completion of the light exposure through the image bearing transparency disposed thereon. Alternatively, a solvent-soluble, thin, flexible layer may be formed on the composition instead of the above-mentioned film (see, for example, U.S. Pat. No. 4,266,005). In this case, after completion of the light exposure through the image bearing transparency, the flexible layer is removed by dissolution or the like simultaneously with the wash-out of the unexposed portion.

The photosensitive elastomer composition of the present invention can be prepared by various methods. For example, there may be employed a method in which the ingredients are dissolved and mixed in a suitable solvent, such as chloroform, carbon tetrachloride, 1,1,1-trichloroethane, tetrachloroethylene, trichloroethylene, methylethylketone, methylisobutylketone, toluene and tetrahydrofuran and then, the resultant mixture is flow-cast into a mold to evaporate the solvent, thereby obtaining a plate for use in exposure treatment. In this instance, however, a further heat press treatment on the plate of the photosensitive elastomer composition improves the thickness precision thereof. Alternatively, there may be employed a method in which the ingredients are mixed and kneaded by means of a kneader or roll mill without being dissolved in a solvent and then, the resultant kneaded mixture is subjected to molding, such as extrusion molding, injection molding, press molding and calendering, thereby obtaining a sheet having a predetermined thickness.

A protective film or a substrate film can be closely disposed on a photosensitive elastomer composition sheet by roll lamination after the sheet is molded from a photosensitive elastomer composition. Further, heat-pressing of the sheet after the roll lamination improves the thickness precision of the photosensitive layer. When the formation of a solvent-soluble thin flexible layer, such as a layer of 1,2-polybutadiene, soluble polyamide, partially saponified polyvinyl acetate, or cellulose ester, etc., on the surface of a photosensitive layer is to be conducted, one such material is dissolved in a suitable solvent and the resultant solution may be directly coated on the surface of the photosensitive layer. Alternatively, there may be employed a method in which the obtained solution is coated on a film of polyester, polypropylene or the like and then, the coated film is laminated on a photosensitive layer so that the solvent-soluble layer is brought into contact with the photosensitive layer.

Examples of the sources of actinic rays usable for the insolubilization of the photosensitive elastomer composition of the present invention so as to be solvent-insoluble include high pressure mercury lamps, ultraviolet fluorescent lamps, carbon arc lamps, xenon lamps, zirconium lamps and the sun light.

With respect to the developer (solvent) to be used to wash-out an unexposed portion after an image has been formed by irradiating the photosensitive elastomer composition of the present invention with actinic rays through an image bearing transparency, it is necessary that the developer be capable of effectively dissolving or dispersing the unexposed portion and have substantially no adverse effect on the image portion obtained by exposure. Examples of such developers include chlorine-containing organic solvents, such as 1,1,1-trichloroethane and tetrachloroethylene, esters, such as heptyl acetate and 3-methoxybutyl acetate, hydrocarbons, such as petroleum fractions and toluene and mixtures obtained by admixing these with an alcohol, such as propanol and butanol.

The wash-out of the unexposed portion is effected by jetting a developer from a nozzle, or by brushing in a developer. The wash-out is usually conducted by brushing.

The production of a flexographic printing plate from the photosensitive elastomer composition of the present invention can be conducted, for example, by the following method. There is provided a laminate structure comprised of a substrate film which may or may not have an adhesive layer, a photosensitive elastomer composition sheet having a predetermined thickness, and a cover sheet which may or may not have a polymer layer (soluble flexible polymer layer) which is soluble or dispersible in a solvent capable of dissolving or dispersing an uncured (not yet insolubilized) photosensitive composition. Then, the cover sheet is peeled off from the laminate structure while leaving the soluble polymer layer as it is. Next, back exposure is conducted over the substrate side [Step (a)] to cure the entire surface of the substrate side of the photosensitive elastomer composition and, further, an image bearing transparency, such as a negative film, is closely disposed on the soluble polymer layer [Step (b)], followed by relief exposure through the image bearing transparency. In this instance, Steps (a) and (b) may be conducted in the reverse order. Further, an unexposed portion is washed-out from the cured (insolubilized) composition layer with the above-mentioned developer (for example, chlorine-containing solvents, such as tetrachloroethylene and 1,1,1-trichloroethane and mixtures thereof with an alcohol), to effect development, thereby obtaining a relief printing plate. The thus obtained printing plate is washed and dried and then, subjected to post-exposure. The post-exposure may be conducted in water, and in such a case, the drying can be carried out after the post-exposure.

As mentioned above, with respect to the order of the above-mentioned back exposure and relief exposure, it is not necessary to perform back exposure first. Relief exposure may be performed first, or both exposures may be performed simultaneously. Further, back exposure is not essential and can be omitted. Generally, however, from the viewpoint of obtaining a stable relief, it is preferred to perform back exposure and, in this instance, to perform back exposure before relief exposure as mentioned above. When back exposure is performed, it is necessary that a substrate film be transparent to actinic rays.

The photosensitive elastomer composition of the present invention exhibits excellent properties as a material for producing a flexographic printing plate, but the composition can also be used in the production of a photoresist and a screen for screen printing. Best Mode for Carrying Out the Invention Hereinbelow, the present invention will be illustrated with reference to Examples, which however should not be construed as limiting the present invention.

Example 1

3 kg of a polystyrene-polybutadiene-polystyrene block copolymer (styrene content: 25%, vinyl linkage content: 30%, melt index (MI) under condition G in accordance with ASTM D1238: 13), 1 kg of liquid polybutadiene (number average molecular weight: 2000), 500 g of dioctyl fumarate, 150 g of polypropylene glycol diacrylate, 90 g of 2,2-dimethoxy-2-phenylacetophenone, and 9 g of 2,6-di-t-butyl-p-cresol were kneaded in a kneader, thereby obtaining a photosensitive elastomer composition.

The above-mentioned photosensitive elastomer composition was sandwiched between a 100 μ-thick polyester film having a urethane adhesive layer and a polyester film having an ethyl cellulose layer so that the composition was in contact with the adhesive layer and the ethyl cellulose layer. The resultant laminate was subjected to press molding in a pressing machine, using a 3 mm-thick spacer.

From the resultant sheet, the polyester film which was in contact with the ethyl cellulose was stripped off to expose the cellulose derivative layer. A negative film was closely disposed on the exposed cellulose derivative layer on an AFP-1500 light exposure machine (manufactured and sold by Asahi Kasei Kogyo K.K., Japan) and then, imagewise exposure was conducted at 4200 mj/cm$^2$ by means of an ultraviolet fluorescent lamp having a central wavelength at 370 nm (light source intensity: 7 mW/cm$^2$; exposure time: 10 minutes). Then, the photocured elastomer composition layer was subjected to development for 6 minutes with an AFP-1500 developing machine by using a developer comprised of tetrachloroethylene/butanol (volume ratio: 3/1), and dried at 60° C. for one hour, followed by post exposure at 1000 mj/cm$^2$ using the same light source as employed for the imagewise exposure. Further, the photocured plate was irradiated with rays from a germicidal lamp to remove the surface tack. Thus, a flexographic printing plate was obtained.

In the thus obtained printing plate, highlight formation was completed up to a highlight of 100 lines/inch 3%, and no chipped portion was observed in the relief portion.

Using this printing plate, flexographic printing was performed on a white polyethylene film. As a result, good prints were obtained. Comparative Example 1

A photosensitive elastomer composition sheet was obtained in substantially the same manner as in Example 1 except that a polystyrene-polybutadiene-polystyrene block copolymer having a styrene content of 25% and a vinyl linkage content of 13% and exhibiting a melt index (MI) of 13 under condition G in accordance with ASTM D1238, was used as a polystyrene-polybutadienepolystyrene block copolymer.

From the thus obtained sheet, a printing plate was obtained in the same manner as in Example 1. In the obtained plate, with respect to a highlight of 100 lines-/inch 3%, the degree of the formation of the highlight was 20% or less in terms of the number of highlight relief portions having the above-mentioned size. Further, chipping which was considered to have occurred at the time of development was observed at numerous portions in the reliefs corresponding to the characters and lines.

Examples 2 to 5 and Comparative Example 2

A photosensitive elastomer composition sheet was prepared in substantially the same manner as in Example 1, except that the type of the block copolymer in the photosensitive elastomer composition was varied. Using the thus obtained sheet, a printing plate was produced in the same manner as in Example 1.

Results are shown in the Table 1 below.

TABLE 1

| | Block Copolymer | | | Light exposure dose required to form a highlight of 100 lines/inch 3% (mj/cm²) | Chipping caused in relief at the time of development |
|---|---|---|---|---|---|
| | Styrene content | Vinyl linkage content | MI (condition G) | | |
| Example 2 | 30 | 25 | 10 | 4800 | 0 |
| Example 3 | 30 | 30 | 15 | 4200 | 0 |
| Example 4 | 35 | 20 | 6 | 4600 | 0 |
| Example 5 | 20 | 40 | 12 | 3600 | 0 |
| Comparative Example 2 | 40 | 13 | 12 | 7200 | 30 |

Example 6

1500 g of a polystyrene-polybutadiene-polystyrene block copolymer (styrene content:30%, vinyl linkage content:30%, melt index (MI) under condition G in accordance with ASTM D1238:12), 1500 g of a polystyrene-polybutadiene-polystyrene block copolymer (styrene content: 30%, vinyl linkage content: 13%, melt index (MI) under condition G in accordance with ASTM D1238: 12), 150 g of alkane diol (14 to 15 carbon atoms) diacrylate, 50 g of 2,2-dimethoxy-2-phenylacetophenone and 5 g of 2,6-di-t-butyl-p-cresol were kneaded in a kneader, thereby obtaining a photosensitive elastomer composition.

A photosensitive elastomer composition sheet was produced in substantially the same manner as in Example 1, except that the above-obtained photosensitive elastomer composition was used.

Next, from the obtained sheet, a flexographic printing plate was produced in the same manner as in Example 1. As a result, a highlight of 100 lines/inch 3% could be formed at a light exposure dose of 4500 mj/cm². Further, no chipped portion was observed in the relief portion of the obtained plate.

Example 7

A photosensitive elastomer composition sheet was obtained in substantially the same manner as in Example 1, except that use was made of a poly(α-methylstyrene)-polybutadiene-poly(α-methylstyrene) block copolymer (α-methylstyrene content: 30%, vinyl linkage content: 30%, melt index (MI) under condition G in accordance with ASTM D 1238: 10).

Using the obtained sheet, a flexographic printing plate was produced in the same manner as in Example 1. As a result, a highlight of 100 lines/inch 3% could be formed at a light exposure dose of 4200 mj/cm². Further, no chipped portion was observed in the relief portion of the obtained plate.

Example 8

A photosensitive elastomer composition sheet was obtained in substantially the same manner as in Example 1, except that a (polystyrene-polybutadiene)4Si radial type block copolymer (styrene content:30% vinyl linkage content:25%, melt index (MI) under condition G in accordance with ASTM D1238: 8) was used and 500 g of dihexyl fumarate and 150 g of N-lauryl maleimide were used as ethylenically unsaturated compounds.

A flexographic printing plate was produced from the thus obtained sheet in the same manner as in Example 1. As a result, a highlight of 100 lines/inch 3% could be formed at alight exposure dose of 4700 mj/cm². Further, no chipped portion was observed in the relief portion of the obtained plate.

Example 9

A photosensitive elastomer composition sheet was produced in substantially the same manner as in Example 1 except that use was made of 3.5 Kg of a polystyrene-polybutadiene-polystyrene block copolymer (styrene content:25%, vinyl linkage content 30%, melt index (MI) under condition G in accordance with ASTM D1238: 10), 0.8 Kg of liquid polybutadiene (number average molecular weight:2000), 0.6 Kg of dilauryl fumarate, 0.1 Kg of hexanediol diacrylate, 120 g of 2,2-dimethoxy-2-phenylacetophenone, and 15 g of 2,6-di-ti-butyl-p-cresol.

The polyester film which was in contact with the ethyl cellulose was stripped off from the obtained sheet to expose the cellulose derivative layer. A negative film was closely disposed on the exposed cellulose derivative layer on an AFP-1500 light exposure machine (manufactured and sold by Asahi Kasei Kogyo K.K., Japan) and then, back exposure was conducted from the substrate side for 25 seconds at a light source intensity of 4.8 mw/cm² by means of an ultraviolet fluorescent lamp having a central wavelength at 370 nm, followed by imagewise exposure conducted for 20 minutes (at 8400 mj/cm²) through the negative film at a light source intensity of 7 mw/cm² by means of an ultraviolet fluorescent lamp having a central wavelength at 370 nm.

Then, the photocured elastomer composition layer was subjected to development for 6 minutes by using the same developer as used in Example 1 and an AFP-1500 developing machine, and dried at 60° C. for one hour, followed by post exposure at a 1000 mj/cm² using the same light source as employed for the imagewise exposure. Further, the photocured plate was irradiated with rays from a germicidal lamp at 750 mj/cm² to remove the surface tack. Thus a flexographic printing plate was obtained.

In the thus obtained printing plate, highlight formation was completed up to a highlight of 133 lines/inch 1%, and no chipped portion was observed in the relief portion.

Using the obtained plate, flexographic printing was performed on a white polyethylene film. As a result, good prints having abroad range of gradation reproduction were obtained.

Comparative Example 3

A photosensitive elastomer composition sheet was obtained in substantially the same manner as in Example 9, except that a polystyrene-polybutadiene-polystyrene block copolymer (styrene content:25%, vinyl linkage content:14%, melt index (MI) under condition G in accordance with ASTM D1238: 10) was used as a thermoplastic block copolymer. From this sheet, a printing plate was produced in the same manner as in Example 9. With respect to a highlight of 133 lines/inch 1% in the thus obtained plate, the degree of the formation of the highlight was 20% or less in the same of the number of highlight relief portions having the above-mentioned size.

Next, a printing plate was produced in substantially the same manner as mentioned above except that in the imagewise exposure through a negative film, the light exposure dose was increased up to 14000 mj/cm². However, the degree of the formation of a highlight of 133 lines/inch 1% in the plate was only about 50%. Further, in this plate, a reverse line of 400 μ in width had suffered compete disappearance (no formation).

Industrial Applicability

The photosensitive elastomer composition of the present invention comprising a specific amount of a thermoplastic block copolymer comprising a monovinyl substituted aromatic hydrocarbon polymer block and a conjugated diene polymer block, wherein the monovinyl substituted aromatic hydrocarbon content (A) and the vinyl content (V) of the conjugated diene are respectively in specific ranges and the contents (A) and (V) satisfy a specific relationship; an ethylenically unsaturated compound component; and a photopolymerization initiator, exhibit excellent photosensitivity. Therefore, when this composition is used to produce, for example, a flexographic printing plate, not only can the time for the plate production be reduced to about half the time which has conventionally been necessary, but also small dots and lines can surely be formed, and occurrence of chipping of the plate can be prevented, thereby enabling the production of an excellent flexographic printing plate capable of printing fine images.

We claim:

1. A photosensitive elastomer composition comparing:
    (1) at least 50% by weight, based on the weight of the elastomer composition, of a thermoplastic block copolymer comprising at least one monovinyl substituted aromatic hydrocarbon polymer block comprised mainly of a monovinyl substituted aromatic hydrocarbon and at least one conjugated diene polymer block comprised mainly of a conjugated diene,
    said block copolymer having a monovinyl substituted aromatic hydrocarbon content (A) of 10 to 35% by weight and
    said conjugated diene having a vinyl content (V) of 20 to 50%,
    wherein said (A) and said (V) satisfy the following formula:

$$40 \leq (A)+(V) \leq 70;$$

(2) 1 to 20% by weight, based on the weight of the elastomer composition, of an ethylenically unsaturated compound component; and
    (3) 0.1 to 3% by weight, based on the weight of the elastomer composition, of a photopolymerization initiator.

2. The photosensitive elastomer composition according to claim 1, wherein said component (2) is at least one member selected from the group consisting of an acrylate, a methacrylate, a maleimide, a compound represented by the following formula (I):

wherein each of $R^1$ and $R^2$ independently represents an alkyl group having 2 to 30 carbon atoms, an aryl group having 2 to 30 carbon atoms or an aralkyl group having 2 to 30 carbon atoms,
and a geometrical isomer of the compound of formula (I).

3. The photosensitive elastomer composition according to claim 1 or 2, wherein said component (2) comprises at least 20% by weight of a compound of said formula (I), based on the weight of said component (2).

4. The photosensitive elastomer composition according to claim 3, wherein the proportion of a compound of said formula (I) present in said component (2) is at least 50% by weight.

5. The photosensitive elastomer composition according to claim 3, wherein each of $R^1$ and $R^2$ of formula (I) independently represents an alkyl group having 6 to 12 carbon atoms.

6. The photosensitive elastomer composition according to claim 1 or 2, wherein said monovinyl substituted aromatic hydrocarbon polymer block of the thermoplastic block copolymer (1) is a polystyrene block.

7. The photosensitive elastomer composition according to claim 1 or 2, wherein said conjugated diene polymer block of the thermoplastic block copolymer (1) is a polybutadiene block.

8. The photosensitive elastomer composition according to claim 1 or 2, wherein said thermoplastic block copolymer (1) contains at least two monovinyl substituted aromatic hydrocarbon polymer blocks.

* * * * *